US005783457A

United States Patent [19]

Hsu

[11] Patent Number: 5,783,457
[45] Date of Patent: Jul. 21, 1998

[54] METHOD OF MAKING A FLASH MEMORY CELL HAVING AN ASYMMETRIC SOURCE AND DRAIN POCKET STRUCTURE

[75] Inventor: Chen-Chung Hsu, Taichung, Taiwan

[73] Assignee: United Microelectronics Corporation, Taiwan

[21] Appl. No.: 807,887

[22] Filed: Feb. 26, 1997

[30] Foreign Application Priority Data

Dec. 27, 1996 [TW] Taiwan .................. 85116177

[51] Int. Cl.[6] .................. H01L 21/8247; H01L 21/265
[52] U.S. Cl. .................. 437/35; 437/43
[58] Field of Search .................. 437/35, 43, 52, 437/29

[56] References Cited

U.S. PATENT DOCUMENTS

| | | | |
|---|---|---|---|
| 5,316,961 | 5/1994 | Okazawa | 437/43 |
| 5,366,915 | 11/1994 | Kodama | 437/43 |
| 5,432,106 | 7/1995 | Hong | 437/35 |
| 5,510,279 | 4/1996 | Chien et al. | 437/41 |
| 5,518,942 | 5/1996 | Shrivastava | 437/43 |
| 5,595,919 | 1/1997 | Pan | 437/29 |

*Primary Examiner*—John Niebling
*Assistant Examiner*—Richard A. Booth
*Attorney, Agent, or Firm*—Rabin,Champagne & Lynt, P.C.

[57] ABSTRACT

A method of making a flash memory cell includes patterning a series of layers over a semiconductor substrate of a first conductivity type to form a gate electrode structure. A first ion implantation procedure is performed to introduce a first impurity of a second conductivity type into the semiconductor substrate and form a heavily-doped source region and a heavily-doped drain region. A second ion implantation procedure is performed at a tilt angle of 25° to 45°, to introduce a second impurity of the second conductivity type into the semiconductor substrate and form a pair of asymmetric lightly-doped regions, with one of the asymmetric lightly-doped regions surrounding the heavily-doped source region, and the other of the asymmetric lightly-doped regions beneath the heavily-doped drain region. An insulating spacer is formed on sidewalls of the gate electrode structure. A photoresist layer is coated over exposed surfaces of the gate electrode structure, the insulating spacer, and the heavily-doped source region and drain region. The photoresist layer is patterned to form an opening and expose a portion of the gate electrode structure, the insulating spacer, and the heavily-doped drain region. The exposed portion of the insulating spacer is removed. A third ion implantation procedure is performed at a tilt angle of 25° to 45°, to introduce an impurity of the first conductivity type into the semiconductor substrate and form a heavily-doped pocket region surrounding the heavily-doped drain region. The photoresist layer is then removed.

14 Claims, 5 Drawing Sheets

METHOD OF MAKING A FLASH MEMORY CELL HAVING AN ASYMMETRIC SOURCE AND DRAIN POCKET STRUCTURE

BACKGROUND OF THE INVENTION

1. Field of the Invention

This invention relates in general to the manufacture of a fast Electrically Erasable and Programmable Read-Only Memory (EEPROM) device (also known as a flash memory device), and more particularly to a method of making a flash memory cell having an asymmetric source and drain pocket structure.

2. Description of Related Art

EEPROM devices are used in a variety of electronic equipment, including microcomputer systems. The conventional EEPROM device has a memory cell which is comprised of a floating-gate transistor. This conventional device can maintain information written into the memory cell even in the absence of power to the device, and can have such information erased. Flowever, these conventional devices have relatively slow read/write access times, typically in the range of 150 to 200 nSec.

Faster EEPROM devices are also known, for example, devices having read/write access times in the range of 70 to 80 nSec. For example, Intel Corporation of Santa Clara, Calif., has introduced a series of fast EEPROM devices, referred to generically as "Flash Memories".

FIG. 1 illustrates a conventional flash memory cell which is composed of a floating-gate transistor. The floating-gate transistor includes a floating gate 10, a control gate 12 located over floating gate 10, a tunnel oxide layer 14 located under floating gate 10, a drain region 16 and a source region 18. The drain region 16 and source region 18 are symmetrically formed, and located in a semiconductor substrate on two opposite sides of the gate transistor.

When writing to the memory cell, the control gate 12, using a phenomena known as the Fowler-Nordheim's "Tunneling Effect", ejects electrons from drain region 16, through the tunnel oxide layer 14, and into the floating gate 10. This process is known as "hot electron injection". The threshold voltage of the floating-gate transistor can be raised using hot electron injection, so that the device assumes a first memory state that reflects the content of the memory cell.

On the other hand, when erasing the memory cell, the electrons immersed in floating gate 10 are expelled through tunnel oxide layer 14 and back into either the source region 18 or the drain region 16. The removal of the electrons causes a lowering of the threshold voltage, so that the device assumes a second memory state.

The conventional flash memory cell has several disadvantages, for example:

(a) a relatively high voltage must be applied to the drain region 16 and the source region 18 so as to provide the necessary high electric field to eject the electrons from the drain region 16 through the tunnel oxide 14 and into the floating gate 10. This may result in the occurrence of a hot-electron punch-through effect in the floating-gate transistor.

(b) to prevent the hot-electron punch-through effect, the drain region 16 and source region 18 should be spaced apart from each other. Thus, the memory cell cannot be reduced in size for application in small devices, such as sub-micron devices.

SUMMARY OF THE INVENTION

It is therefore an object of the present invention to provide a method of making a flash memory cell in which the hot-electron punch-through effect is prevented, and in which the size of the memory device is reduced.

It is another object of the present invention to provide a method of making a flash memory cell having an asymmetric source and drain pocket structure. A heavily-doped pocket region is asymmetrically formed surrounding the drain region; thus, the critical voltage for erasing data in the flash memory cell can be increased, and the data erase speed of the flash memory cell can be improved.

It is yet another object of the present invention to provide a method of making a flash memory cell having an asymmetric source and drain pocket structure, in which the capacitive coupling ratio in the source region is reduced.

In accordance with the above-mentioned objects of the present invention, a new method of making a flash memory cell having an asymmetric source and drain pocket structure is described. The method includes successively forming a tunnel oxide layer, a first conductive layer, a dielectric layer, and a second conductive layer over a semiconductor substrate of a first conductivity type. The second conductive layer, the dielectric layer, the first conductive layer, and the tunnel oxide layer are patterned to form a gate electrode structure. In a first ion implantation procedure a first impurity of a second conductivity type is introduced into the semiconductor substrate, to form a heavily-doped source region and a heavily-doped drain region. A second ion implantation procedure is then performed at a tilt angle of 25° to 45°, to introduce a second impurity of the second conductivity type into the semiconductor substrate, to form a pair of asymmetric lightly-doped regions, with one of the asymmetric lightly-dopeed regions surrounding the heavily-doped source region, and the other of the asymmetric lightly-doped regions beneath the heavily-doped drain region. An insulating spacer is formed on sidewalls of the gate electrode structure. A photoresist layer is coated over exposed surfaces of the gate electrode structure, the insulating spacer, and the heavily-doped source region and drain region. The photoresist layer is patterned to form an opening and expose a portion of the gate electrode structure, the insulating spacer, and the heavily-doped drain region. The exposed portion of the insulating spacer is then removed. A third ion implantation procedure is performed at a tilt angle of 25° to 45°, to introduce an impurity of the first conductivity type into the semiconductor substrate, to form a heavily-doped pocket region surrounding the heavily-doped drain region. The photoresist layer is then removed.

BRIEF DESCRIPTION OF THE DRAWINGS

Other objects, features and advantages of the present invention will become apparent by way of the following detailed description of the preferred but non-limiting embodiment, with reference to the drawings.

DETAILED DESCRIPTION OF THE PREFERRED EMBODIMENT

Figure 1:
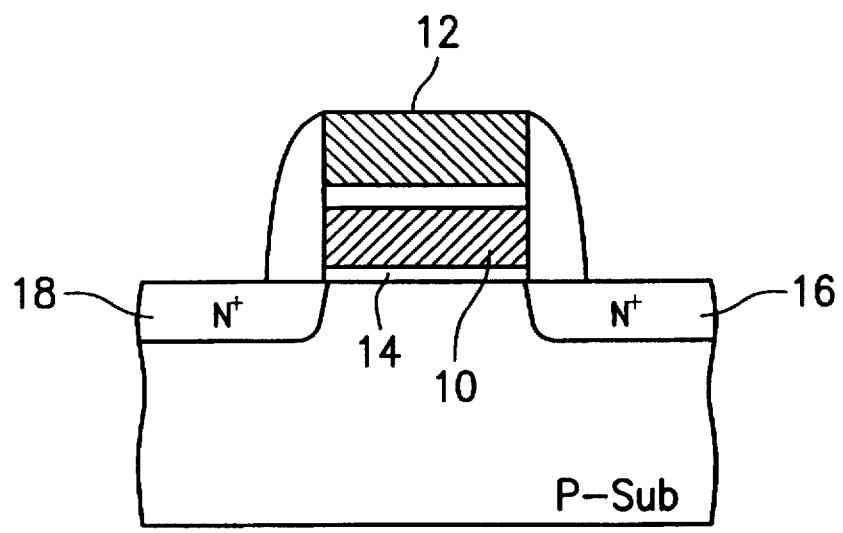
FIG. 1 is a cross sectional view of a conventional floating-gate transistor for a flash memory device.
Figure 2A:
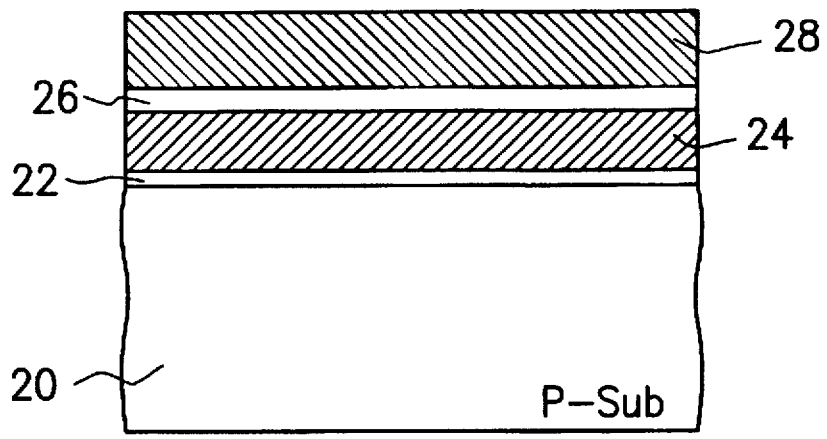
FIGS. 2A to 2G are sequential, cross-sectional views taken during various manufacturing stages of a flash memory cell having an asymmetric source and drain pocket structure, according to the present invention.

Referring to FIG. 2A, a semiconductor substrate 20, for example, a P-type silicon substrate, is shown. A tunnel oxide layer 22 having, for example, a thickness of 60Å to 120Å, is formed over the substrate 20 using either a thermal oxidation or a chemical vapor deposition (CVD) process. A first conductive layer 24, such as a heavily-doped polysilicon layer having a thickness of 800Å to 2000Å, is formed over tunnel oxide layer 22, preferably using CVD techniques.

A dielectric layer 26, such as an oxide/nitride/oxide (O/N/O) stacked layer, is formed over the first conductive layer 24. The dielectric layer 26 can be formed by depositing a bottom oxide layer having a thickness of 50Å to 80Å on the first conductive layer 24. A nitride layer with a thickness of about 180Å is next deposited on the bottom oxide layer. Then, a thermal oxide layer with a thickness of about 30Å is formed on the nitride layer. The three layers having a total thickness of 120Å to 250Å are collectively referred to as the O/N/O stacked layer.

Next, a second conductive layer 28, such as a heavily-doped polysilicon layer having a thickness of 1000Å to 2000Å, is formed over the dielectric layer 26, preferably using CVD techniques.

Figure 2B:
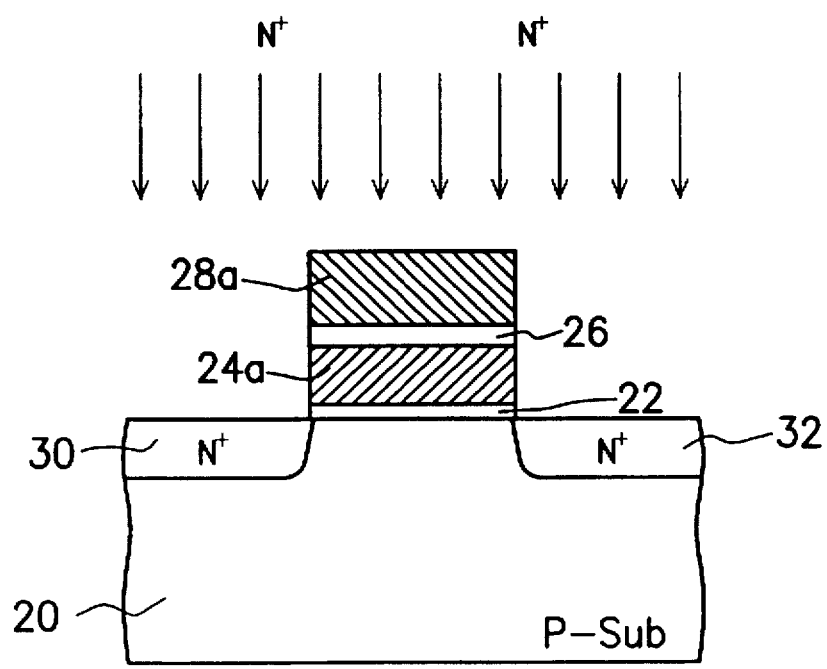

Referring to FIG. 2B, a gate electrode structure is formed by patterning the second conductive layer 28, the dielectric layer 26, the first conductive layer 24, and the tunnel oxide layer 22. For example, the patterning can include coating a photoresist layer (not shown) on the surface of the second conductive layer 28. A photolithography process is then performed to define the pattern of the photoresist layer for covering the portions of the second conductive layer 28 that will form the gate electrode structure. Subsequently, the second conductive layer 28, the dielectric layer 26, the first conductive layer 24, and the tunnel oxide layer 22 are successively etched using the photoresist layer as a mask, to define the gate electrode structure. Once patterned, the first conductive layer 24 forms a floating gate 24a, and the second conductive layer 28 forms a control gate 28a.

After removing the photoresist layer, and using the gate electrode structure as a mask, a first ion implantation process is performed to introduce an N-type impurity into the substrate 20, thus forming a heavily-doped $N^+$ source region 30 and a heavily-doped drain region 32. For example, arsenic ions may be used as the N-type impurity. The arsenic ions may be implanted at an energy of 30 KeV to 100 KeV and at a dosage of $10^{15}$ atoms/cm$^2$ to $10^{16}$ atoms/cm$^2$.

Figure 2C:
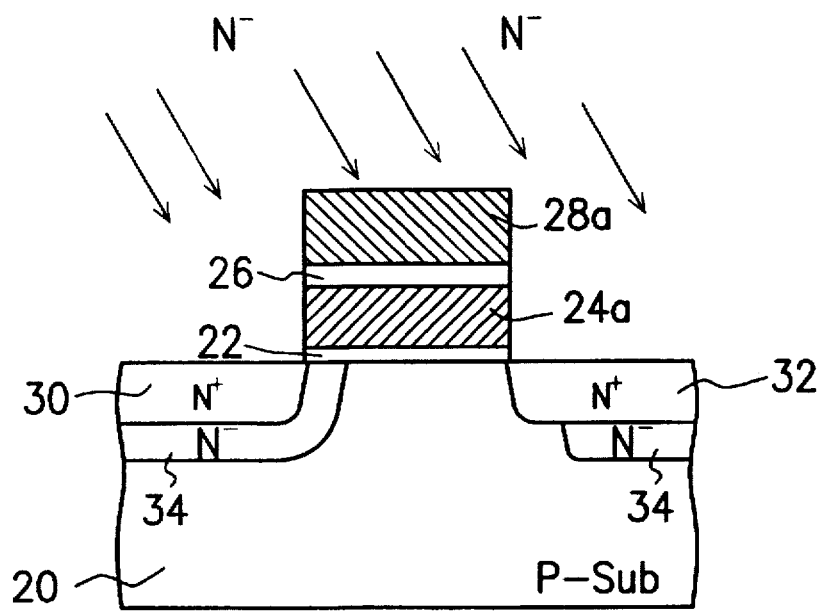

Referring to FIG. 2C, a second ion implantation process is performed at a tilt angle of 25° to 45° (in the figure, in a direction from the upper-left toward the bottom-right). Using the gate electrode structure as a mask, the second ion implantation process introduces another N-type impurity into the substrate 20, to form a pair of asymmetric, lightly-doped $N^-$ regions 34. For example, phosphoric ions may be implanted at an energy of 30 KeV to 80 KeV, and at a dosage of $10^{13}$ to $10^{14}$ atoms/cm$^2$. As is shown in this figure, since the impurity is implanted at an angle, one of the lightly-doped $N^-$ regions 34 will surround the heavily-doped $N^+$ source region 30, and the other of the lightly-doped $N^-$ regions 34 will be located beneath the heavily-doped $N^+$ drain region 32.

Figure 2D:
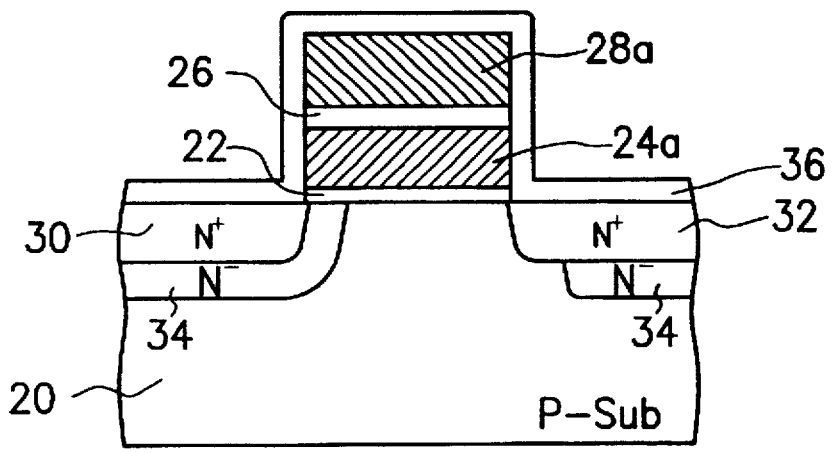

Referring to FIG. 2D, a silicon dioxide layer 36 is formed on the surfaces of the gate electrode structure and the substrate 20, preferably using CVD techniques.

Figure 2E:
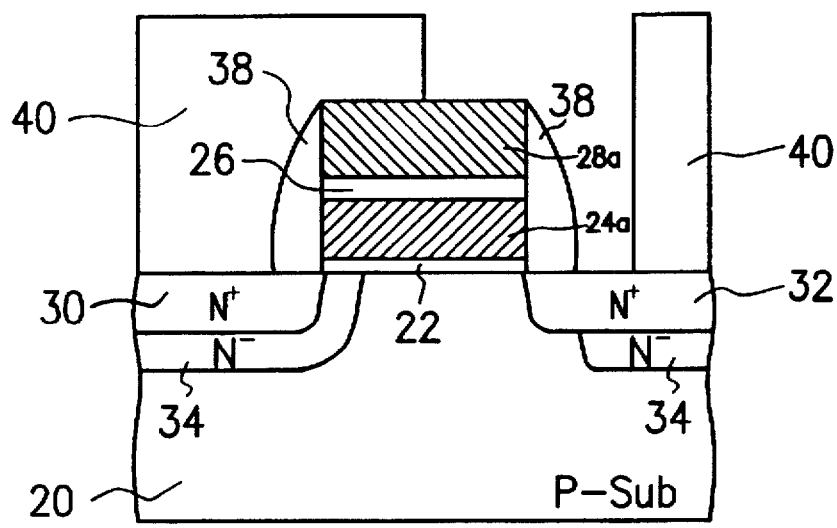

As shown in FIG. 2E, the silicon dioxide layer 36 is etched back using, for example, a reactive ion etch (RIE), leaving behind a portion of the silicon dioxide layer 36 on the sidewalls of the gate electrode structure. This forms an insulating spacer 38 on the sidewalls of the gate electrode structure. Next, a further photoresist layer 40 is coated over the surfaces of the gate electrode structure, the insulating spacer 38, and the heavily-doped $N^+$ source region 30 and drain region 32. A photolithography process is performed to pattern the photoresist layer 40, and form an opening which exposes a portion of the gate electrode structure, the insulating spacer 38, and the heavily-dope $N^+$ drain region 32.

Figure 2F:
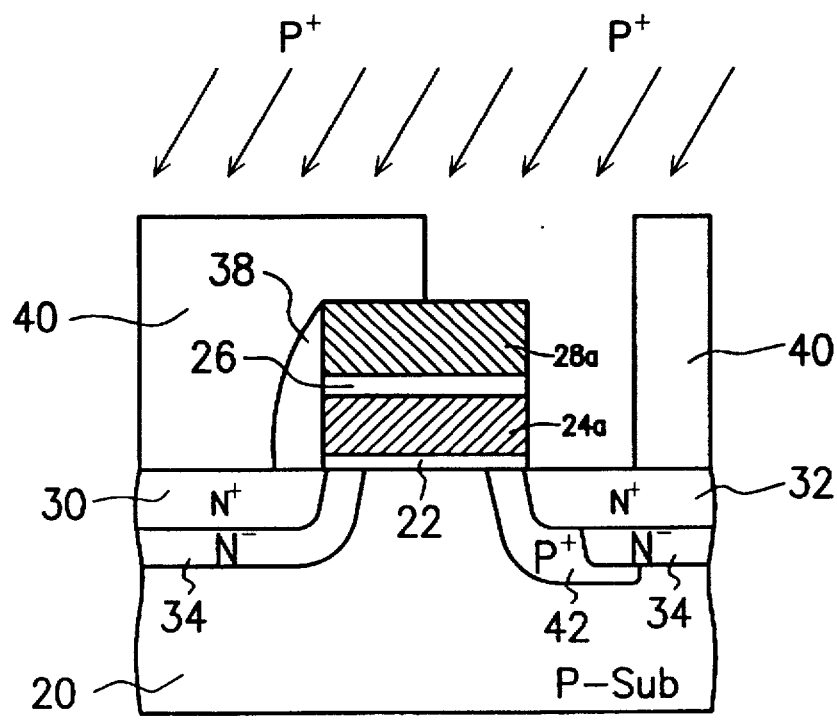

Referring to FIG. 2F, an etching process, for example wet etching, is performed to remove the portion of the insulating spacer 38 within the opening of the photoresist layer 40. Using the photoresist layer 40 and the gate electrode structure as a mask, a third ion implantation process is performed at a tilt angle of 25° to 45° to introduce a P-type impurity into the substrate 20, thereby to form a heavily-doped $P^+$ pocket region 42. For example, boron ions may be implanted at an energy of 60 KeV to 80 KeV, and at a dosage of $10^{15}$ to $10^{16}$ atoms/cm$^2$. Since the P-type impurity is implanted at an angle (and in the figure, in a direction from the upper-right toward the bottom-left), the heavily-doped $P^+$ pocket region 42 will surround the heavily-doped $N^+$ drain region 32.

Figure 2G:
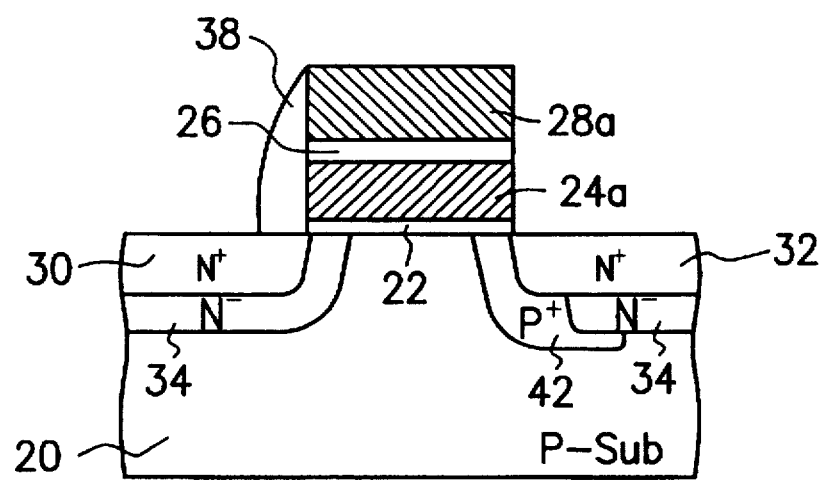

Referring to FIG. 2G, the photoresist layer 40 is removed using a suitable solvent to complete the fabrication of the flash memory cell.

When writing data to the memory cell, a relatively high writing voltage is applied to the control gate 28a, and an appropriate working voltage is applied between the heavily-doped $N^+$ source region 30 and drain region 32. This will cause hot electrons to be ejected from the heavily-doped $N^+$ source region 30, through a portion of the tunnel oxide layer 22 near the heavily-doped $N^+$ drain region 32, and into the floating-gate 24a. The hot electron injection raises the threshold voltage of the floating-gate transistor, so that the device assumes a first memory state that reflects the content of the memory cell. When erasing the memory cell, the electrons immersed in the floating gate 24a are expelled through the tunnel oxide layer 22 and back into either the heavily-doped $N^+$ source region 30 or the drain region 32. This electron removal causes a lowering in the threshold voltage, so that the device assumes a second memory state.

As will be appreciated by those skilled in the art, a flash memory cell with an asymmetric source and drain pocket structure which is fabricated using the manufacturing method of this invention will have the following advantages:

(1) All of the doped regions except the asymmetric pocket region 42 can be formed using self-aligned techniques. For example, only one photolithography process is needed to pattern the photoresist layer 40 so as to expose a portion of the gate electrode structure, the insulating spacer 38, and the heavily-doped $N^+$ drain region 32.

(2) The heavily-doped $N^+$ source region 30 and the surrounding lightly-doped $N^-$ region 34 together form an $N^+$ -$N^-$ double diffused profile structure. This improves the breakdown voltage of the memory device, allowing for a higher voltage to be used for data erasing operations than in a conventional flash memory device.

(3) The P-type pocket region 42 surrounding the heavily-doped $N^+$ drain region 32 reduces the depletion region of the floating-gate transistor. Thus, short-channel effects can be prevented even when used in a sub-half-micron application.

While the invention has been described by way of example and in terms of a preferred embodiment, it is to be understood that the invention is not be limited thereto. To the contrary, it is intended that the invention cover various modifications and similar arrangements within the spirit and scope of the appended claims, which should be accorded the broadest interpretation so as to encompass all such modifications and similar arrangements.

What is claimed is:

1. A method of making a flash memory cell having an asymmetric source and drain pocket structure, comprising:

successively forming a tunnel oxide layer, a first conductive layer, a dielectric layer, and a second conductive layer over a semiconductor substrate of a first conductivity type;

patterning the second conductive layer, the dielectric layer, the first conductive layer, and the tunnel oxide layer to form a gate electrode structure;

performing a first ion implantation procedure to introduce a first impurity of a second conductivity type into the semiconductor substrate, thereby to form a heavily-doped source region and a heavily-doped drain region;

performing a second ion implantation procedure at a tilt angle of 25° to 45°, to introduce a second impurity of the second conductivity type into the semiconductor substrate, so as to form a pair of asymmetric lightly-doped regions, with one of the asymmetric lightly-doped regions surrounding the heavily-doped source region, and the other of the asymmetric lightly-doped regions beneath the heavily-doped drain region;

forming an insulating spacer on sidewalls of the gate electrode structure;

coating a photoresist layer over exposed surfaces of the gate electrode structure, the insulating spacer, and the heavily-doped source and drain regions;

patterning the photoresist layer to form an opening and expose a portion of the gate electrode structure, the insulating spacer, and the heavily-doped drain region;

removing the exposed portion of the insulating spacer;

performing a third ion implantation procedure at a tilt angle of 25° to 45°, to introduce an impurity of the first conductivity type into the semiconductor substrate, and forming a heavily-doped pocket region surrounding the heavily-doped drain region; and removing the photoresist layer.

2. The method recited in claim 1, wherein the first conductivity type is a P-type and the second conductivity type is an N-type.

3. The method recited in claim 1, wherein the first and second conductive layers comprise heavily-doped polysilicon layers.

4. The method recited in claim 1, wherein the dielectric layer comprises an oxide/nitride/oxide stacked layer.

5. The method recited in claim 1, wherein the first impurity of the second conductivity type comprises arsenic ions.

6. The method recited in claim 5, wherein said performing a first ion implantation procedure comprises implanting the arsenic ions at an energy of 30 KeV to 100 KeV, and at a dosage of $10^{15}$ to $10^{16}$ atoms/cm$^2$.

7. The method recited in claim 1, wherein the second impurity of the second conductivity type comprises phosphorous ions.

8. The method recited in claim 7, wherein said performing a second ion implantation procedure comprises implanting the phosphorous ions at an energy of 30 KeV to 80 KeV, and at a dosage of $10^{13}$ to $10^{14}$ atoms/cm$^2$.

9. The method recited in claim 1, wherein the impurity of the first conductivity type comprises boron ions.

10. The method recited in claim 9, wherein said performing a third ion implantation procedure includes implanting the boron ions at an energy of 60 KeV to 80 KeV, and at a dosage of $10^{14}$ to $10^{15}$ atoms/cm$^2$.

11. The method recited in claim 1, wherein said patterning the second conductive layer, the dielectric layer, the first conductive layer, and the tunnel oxide layer includes patterning the first conductive layer to form a floating gate and patterning the second conductive layer to form a control gate.

12. The method recited in claim 1, wherein said performing a first ion implantation procedure includes using the gate electrode structure as a mask.

13. The method recited in claim 1, wherein said performing a second ion implantation procedure includes using the gate electrode structure as a mask.

14. The method recited in claim 1, wherein said performing a third ion implantation procedure includes using the photoresist layer and the gate electrode structure as a mask.

* * * * *